United States Patent [19]
Wilson et al.

[11] Patent Number: 4,755,865
[45] Date of Patent: Jul. 5, 1988

[54] MEANS FOR STABILIZING POLYCRYSTALLINE SEMICONDUCTOR LAYERS

[75] Inventors: Syd. R. Wilson; Richard B. Gregory, both of Phoenix; Charles J. Varker, Scottsdale, all of Ariz.

[73] Assignee: Motorola Inc., Schaumberg, Ill.

[21] Appl. No.: 36,232

[22] Filed: Apr. 9, 1987

Related U.S. Application Data

[62] Division of Ser. No. 821,095, Jan. 21, 1986.

[51] Int. Cl.$^4$ .................. H01L 29/78; H01L 29/167; H01L 29/04
[52] U.S. Cl. .................. 357/63; 357/23.3; 357/23.7; 357/59
[58] Field of Search .................. 357/23.1, 23.3, 23.7, 357/59 G, 59 E, 63, 91

[56] References Cited

U.S. PATENT DOCUMENTS

| | | | |
|---|---|---|---|
| 4,380,773 | 4/1983 | Goodman | 357/59 G |
| 4,689,667 | 8/1987 | Aronowitz | 357/63 |

FOREIGN PATENT DOCUMENTS

| | | | |
|---|---|---|---|
| 0101739 | 2/1973 | European Pat. Off. | 29/72 |
| 1542651 | 4/1975 | United Kingdom | 29/4 |
| 1536716 | 4/1975 | United Kingdom | 21/42 |

OTHER PUBLICATIONS

IEEE Electron Device Letters, vol. EDL-2, No. 12, Dec. 1981, "Effects of Grain ... Mosfet's", by Ng et al., pp. 316–318.

Primary Examiner—Martin H. Edlow
Assistant Examiner—Donald J. Featherstone
Attorney, Agent, or Firm—Robert M. Handy

[57] ABSTRACT

Implantation of oxygen or nitrogen in polysilicon layers to a dose above about $10^{15}$ ions/cm$^2$ retards rapid grain boundary migration of conventional dopants such as B, P, As, Sb, and the like during dopant activation. Pre-annealing of the poly films to increase the grain size also decreases rapid grain boundary migration. The effects can be combined by first pre-annealing and then implanting oxygen or nitrogen before introducing the dopant. It is desirable to anneal the oxygen implant before introducing the dopant to allow for oxygen diffusion to the grain surfaces where it precipitates and blocks the grain boundaries. Vertical and lateral migration of the dopants can be inhibited by placing the implanted oxygen or nitrogen between the dopant and the location desired to be kept comparatively free of dopants. When very high dopant activation temperatures are used the blocking effect of the oxygen on the grain boundaries is overwhelmed by dopant diffusion through the grains.

7 Claims, 5 Drawing Sheets

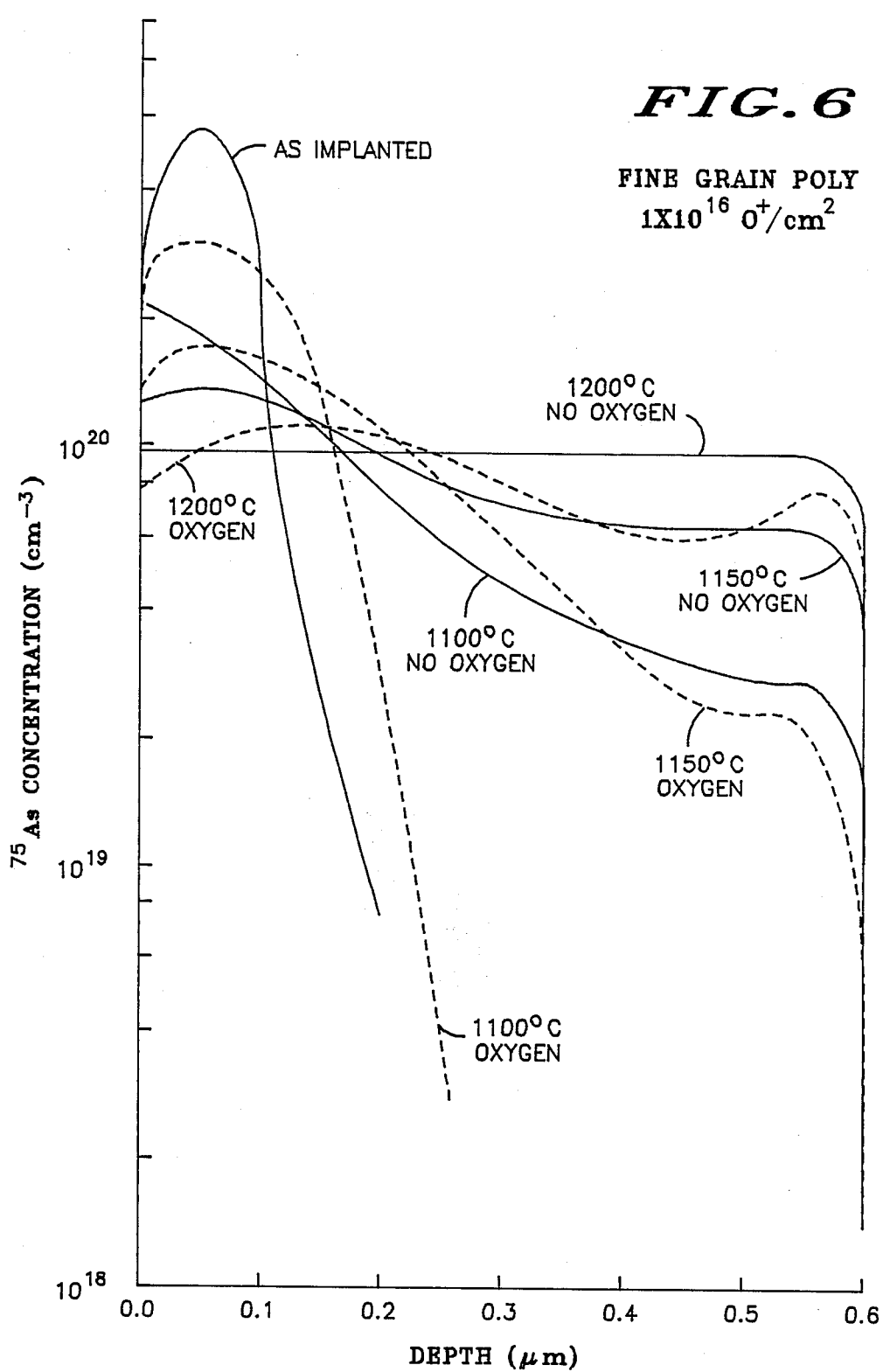

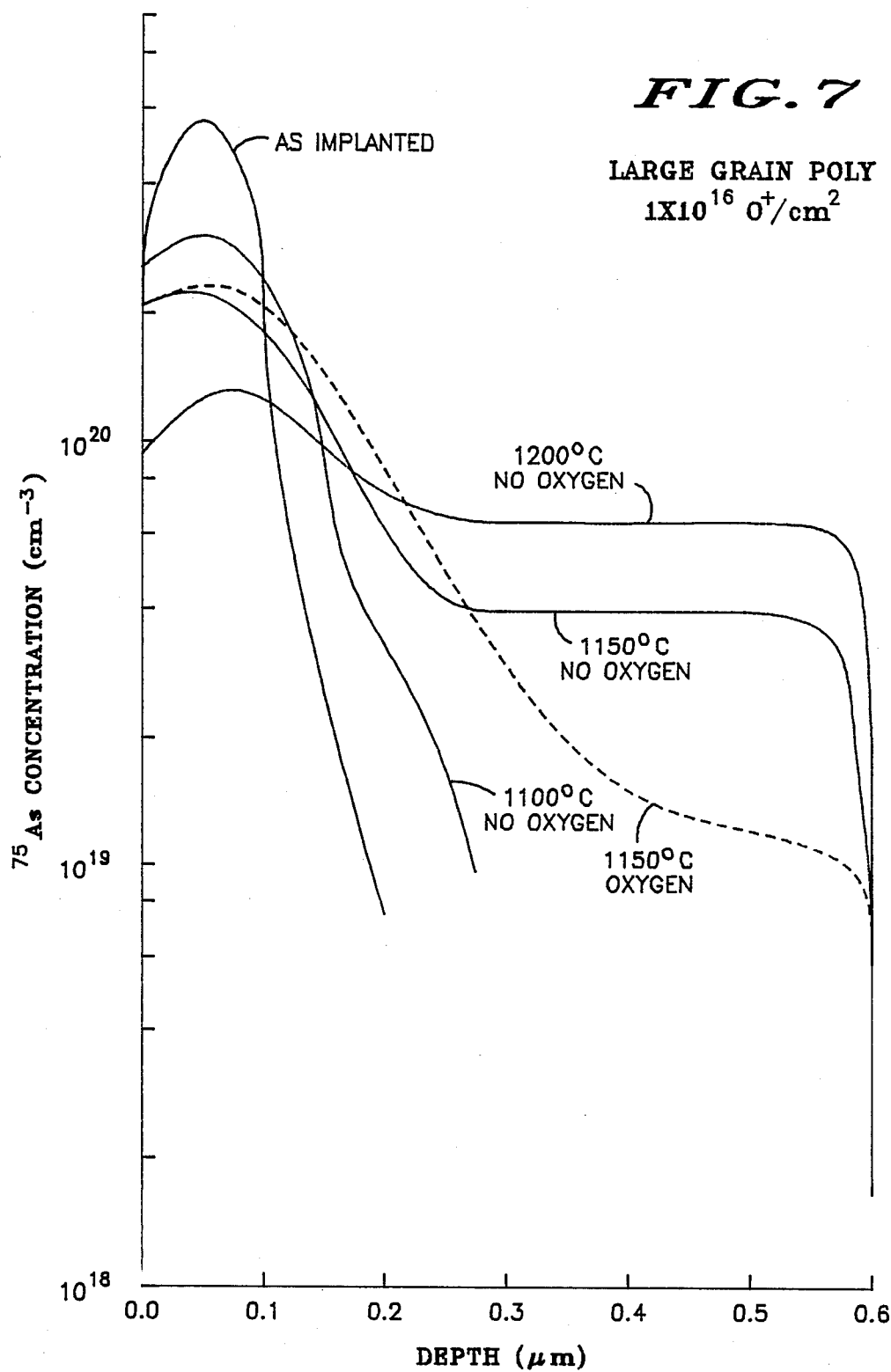

MEANS FOR STABILIZING POLYCRYSTALLINE SEMICONDUCTOR LAYERS

This is a division of application Ser. No. 821,095, filed Jan. 21, 1986.

BACKGROUND OF THE INVENTION

1. Field of the Invention

This invention relates in general to means and methods for stabilizing the properties of polycrystalline semiconductor layers and, more particularly, to means and method for controlling dopant migration in polycrystalline semiconductor layers during high temperature processing.

2. Background Art

Electronic devices using polycrystalline semiconductor regions often exhibit degradation associated with dopant migration in the polycrystalline material. For example, when polycrystalline silicon is employed, the polycrystalline material is often implanted with large concentrations of dopants, such as for example arsenic, boron, or phosphorous, because a low value of sheet resistance is desired. High temperatures often are used to activate the implanted dopant. The dopant will distribute very rapidly in the polycrystalline layer during such heat treatment. Under certain circumstances, dopant concentration peaks occur at poly-oxide interfaces. High dopant concentrations are known to result in oxide degradation. This is particularly troublesome when the oxide is very thin as is often the case with high performance devices, particularly MOS devices employing thin gate oxides.

While this problem may be partially overcome by reducing the dopant concentration, the lower dopant values often make it impossible to obtain sufficiently low sheet resistance. Also, where it is desired to selectively dope poly regions in one location but not in an adjacent location, the rapid vertical and/or lateral movement of the dopant through the poly material during high temperature processing may make it impossible to obtain the desired localization of doping. Thus, a need continues to exist for improved means and methods for overcoming these and other problems arising in connection with polycrystalline semiconductor layers.

Accordingly, it is an objective of the present invention to provide improved means and methods for controlling redistribution of dopants in polycrystalline semiconductor layers or regions.

It is a further object of the present invention to provide improved means and methods for preventing excess or unwanted lateral diffusion of dopants in polycrystalline semiconductor layers.

It is an additional object of the present invention to provide improved means and methods for preventing excess or unwanted vertical diffusion of dopants in polycrystalline semiconductor layers.

It is an additional object of the present invention to prevent grain boundaries from absorbing and rendering electrically inactive substantial amounts of dopant.

As used herein the words "dopant" or "doping" are intended to refer to the class of impurities which provide substantial number of shallow donor or acceptor levels in the semiconductor so as to substantially alter the conductivity of the material. In the case of silicon materials, examples of this class of dopants are arsenic, boron, phosphorous, antimony, aluminum, gallium, and indium. Those of skill in the art will understand that other such dopant elements exist for use in silicon and other semiconductor materials. Oxygen and nitrogen or mixtures thereof do not substantially alter the conductivity of silicon and thus, for silicon, are not within the definition of the word "dopant" as used herein.

As used herein, the word "substrate" is intended to refer to any type of supporting means whether semiconductor or insulator or metal or combinations thereof. As used herein the words "high temperature" are intended to refer to temperatures where the phenomena of interest are proceeding at a rate significant compared to the time periods of interest. For example, for dopant migration or oxidation of silicon, this is generally about a 1000 degrees C. Those of skill in the art will understand that different temperatures will apply for different materials and phenomena. As used herein the words "dopant ions" are intended to include neutral atoms of the same species, as for example result from implantation of dopant ions into solid materials.

SUMMARY OF THE INVENTION

The attainment of the foregoing and other objects and advantages is achieved through the present invention wherein there is provided a means and method for stabilizing polycrystalline layers so as to retard redistribution of dopants by providing within the polycrystalline material a diffusion inhibiting agent which acts to stabilize the grain boundaries of the polycrystalline layer so that grain boundary diffusion is decreased. It has been discovered that these effects can be accomplished by implanting oxygen into the polycrystalline layer either before introducing the dopant or after the introduction of the dopant and prior to high temperature heat treatments. The implanted oxygen inhibits rapid diffusion of the dopant along the grain boundaries of the polycrystalline layer. Pre-implant heat treatment of the polycrystalline layer, i.e., heat treatment prior to the oxygen or dopant implants, increases the grain size. This also acts to retard grain boundary diffusion and enhances the effect of the implanted oxygen. Nitrogen or oxygen-nitrogen mixtures can also be used in place of oxygen.

At very low oxygen concentrations, little effect is obtained. Extremely high oxygen concentrations are also not useful because a subsurface dielectric layer can form which may substantially increase the sheet resistance of the polycrystalline semiconductor layer and reduces its usefulness for device purposes.

The details of the present invention are more completely described in the drawings and description which follow.

BRIEF DESCRIPTION OF THE DRAWINGS

FIG. 6 shows the arsenic concentration versus depth in fine grained polysilicon layers for various activation temperatures, with and without implanted oxygen.

FIG. 7 shows data similar to that of FIG. 6 but for large grained polysilicon layers.

DETAILED DESCRIPTION OF THE DRAWINGS

For purposes of explanation, the device structures and methods herein are shown for the case of silicon based semiconductor devices and polycrystalline silicon layers. However, those of skill in the art will understand that these means and methods apply to other semiconductor substrates and other polycrystalline semiconductors, and are presented merely as an aid to understanding and not intended to be limiting, and that other materials and dopants may also be used.

In FIGS. 1-4, unless otherwise noted, implanted or doped regions of the poly are generally shown stippled, dielectric layers or regions are shown hatched, and single crystal regions or undoped poly regions are shown clear. Arrows at the boundaries of implanted doped regions in the poly are used to indicate the direction of movement of the dopant in the poly during heat treatment, e.g., during high temperature activation or annealing.

Figure 1A:
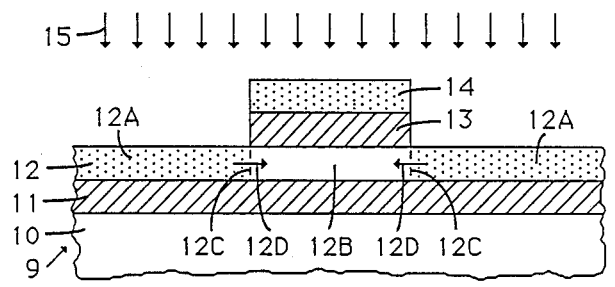
FIGS. 1A-B show simplified schematic cross-sectional views of a portion of a semiconductor device containing a polycrystalline semiconductor layer and illustrating the effect of accelerated lateral grain boundary diffusion in the polycrystalline layer.
Figure 1B:
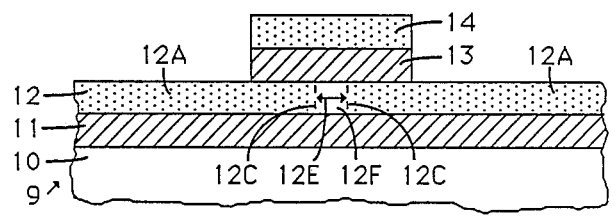

FIGS. 1A-B show in simplified schematic cross-sectional form, portion 9 of a prior art MOS device structure comprising substrate 10, as for example a silicon wafer, covered by dielectric layer 11 and polycrystalline silicon layer 12. Poly layer 12 has thereon gate oxide region 13 and poly gate region 14. Dopant ions 15 are implanted into portions 12a of poly layer 12 and poly gate 14, where they become neutral atoms. Poly gate 14 and gate oxide 13 mask central portion 12b of poly layer 12 so that substantially none of ions 15 are implanted therein. Portions 12a of layer 12 can be used for example as the source and drain of a MOSFET, oxide 13 as the gate dielectric and poly region 14 as the gate.

Boundaries 12c indicate the lateral edges of the as-implanted dopant distribution provided by the masking effect of regions 13 and 14. Arrows 12d indicate the direction of migration or movement of dopant ions 15 in poly layer 12 during the high temperature treatment needed to activate dopant ions 15 and anneal any implant damage in layer 12 and region 14.

It is observed that dopant ions 15 move very rapidly in poly layer 12 during high temperature processing so that after such heating the structure is as shown in FIG. 1B wherein boundaries 12c have moved toward each other until they are separated, if at all, only by small distance 12e. This high temperature migration, which may occur in a few seconds or less in poly crystalline silicon for example, is very much more rapid than is found in single crystal forms of the same material and is believed to proceed along the grain boundaries of the polycrystalline layer. Accelerated migration of dopants along grain boundaries is well known in many materials. Portion 12f of poly layer 12 which remains free of dopant 15, if it exists at all, is likely to be too narrow or too variable in size for proper device operation. Hence, the rapid lateral migration of the dopant makes it difficult or impossible to build consistent, useful devices in this way.

Figure 2A:
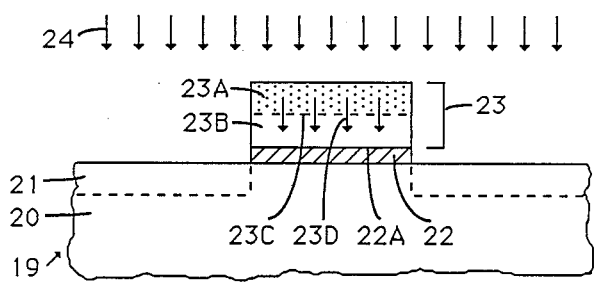
FIGS. 2A-B show simplified schematic cross-sectional views of a portion of a semiconductor device containing a polycrystalline region and illustrating the effects of accelerated vertical grain boundary diffusion in the polycrystalline region.
Figure 2B:
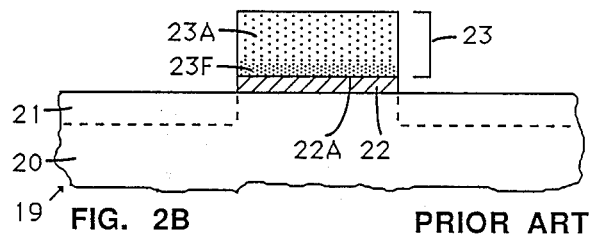

A further grain boundary dopant migration problem occurring with polycrystalline semiconductor layers is illustrated in FIGS. 2A-B. Device portion 19 comprises semiconductor substrate 20, surface dielectric region 22 and superposed poly region 23. Ions 24 are implanted in portion 19 so as to provide doped regions 21, which can function for example as source and drain of a MOSFET. Ions 24 are also implanted in portion 23a in poly region 23. The depth of boundary 23c between implanted portion 23a and non-implanted portion 23b of region 23 is determined by the energy of the implanted ions and their mass. Techniques for determining implant dopant penetration are well known in the art. So long as heating and channelling are not significant, the range of the implanted ions is not substantially affected by the polycrystalline nature of the material. However, when device portion 19 is heated to high temperatures to activate dopant ions 24 in portion 23a (and/or in portions 21), dopant ions 24 migrate rapidly in the direction of arrows 23d until they reach dielectric oxide region 22. As shown in FIG. 2B a portion of dopant ions 24 may pile up against interface 22a of oxide 22. This is indicated by the heavier stippling in region 23f. Heavy dopant concentrations can adversely affect the dielectric strength of oxide region 22 resulting in premature breakdown. This is undesirable. Reducing the dopant concentration in gate region 23 causes a corresponding increase in sheet resistance in region 23 and also in regions 21. This is usually undesirable.

Figure 3:
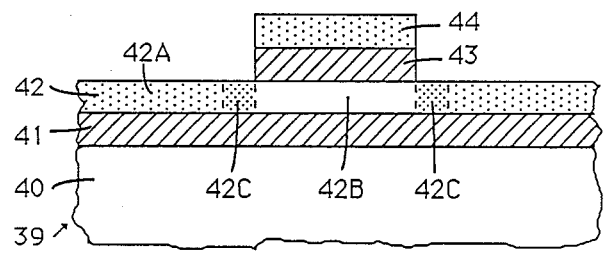
FIG. 3 shows a simplified schematic cross-sectional view similar to that and of FIGS. 1A-B, but according to the present invention.
Figure 4A:
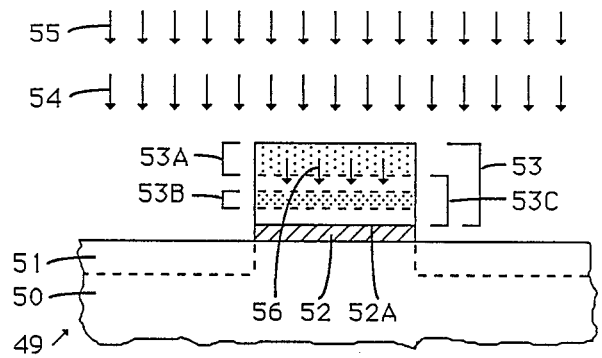
FIGS. 4A-B show simplified schematic cross-sectional views of a portion of a semiconductor device similar to FIGS. 2A-B but according to the present invention.
Figure 4B:
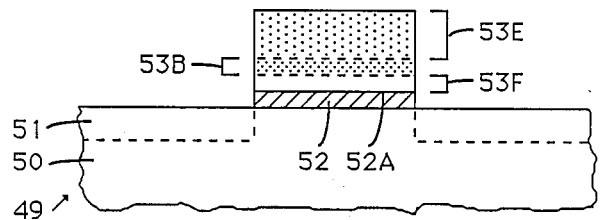
Figure 5:
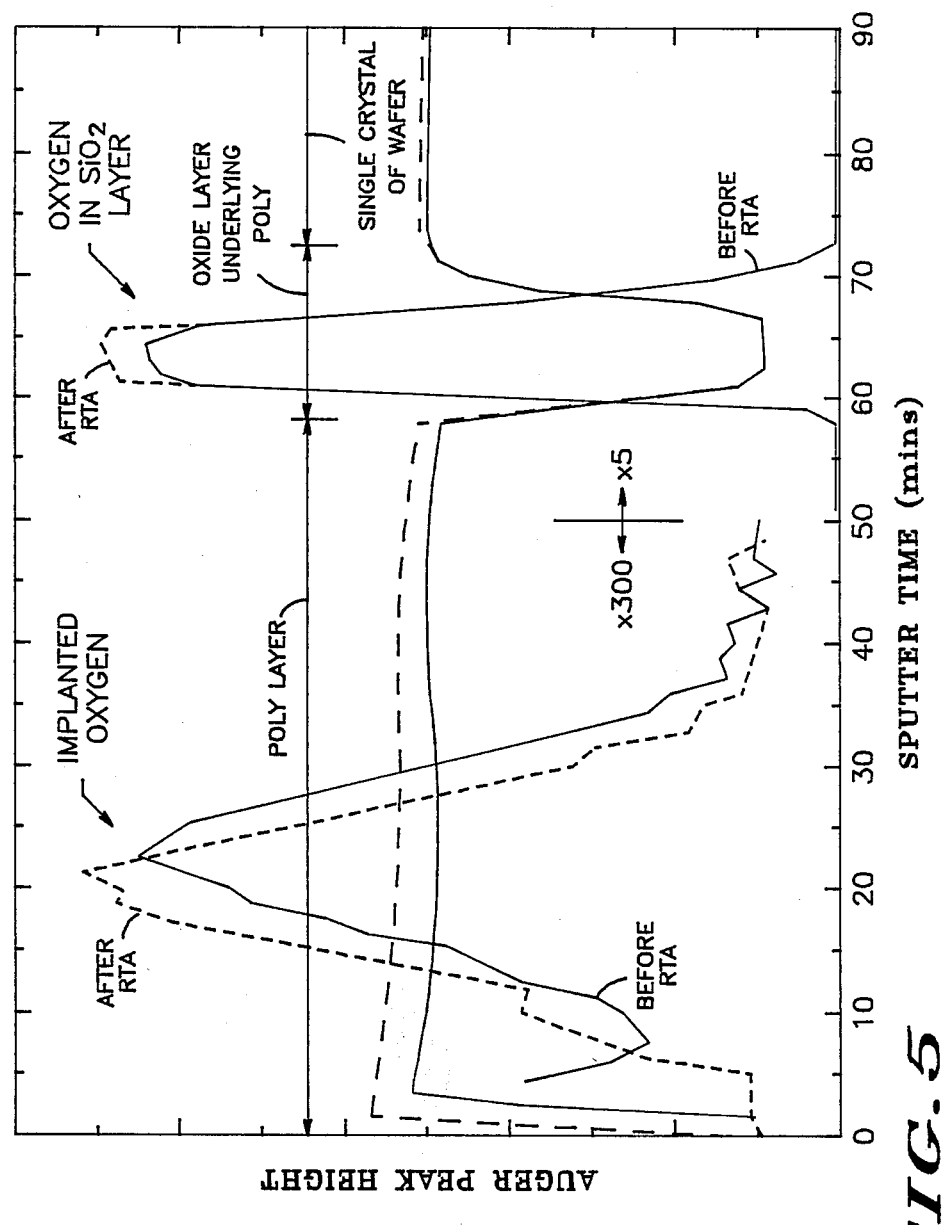
FIG. 5 shows the relative oxygen and silicon concentration as a function of depth for a polysilicon-silicon oxide-silicon structure, as determined by Auger Electron Spectroscopy analysis.

These and other problems are overcome with the means and method of the present invention illustrated in FIGS. 3-4 and described more fully in connection with FIGS. 5-7. FIG. 3 relates to the situation illustrated in FIGS. 1A-B and FIGS. 4A-B relate to the situation illustrated in FIGS. 2A-B.

FIG. 3 illustrates MOSFET structure 39 similar to that in FIGS. 1A-B, comprising substrate 40, dielectric layer 41, poly layer 42, gate dielectric 43 and poly gate 44. The structure of FIG. 3 differs from that of FIGS. 1A-B in that portions 42c of poly layer 42 have been implanted with oxygen or nitrogen or an oxygen-nitrogen mixture prior to any high temperature processing such as might be used to activate the dopant implanted in regions 42a of layer 42. It has been found that implanting oxygen inhibits the rapid migration of dopant ions along the grain boundaries of poly layer 42. Thus, the dopant ions present in regions 42a and in regions 42c are prevented to a significant extent from rapidly migrating into region 42b, where they would alter device behavior. Localization of the implanted oxygen or nitrogen to regions 42a can be accomplished by use of a surface mask. Surface masking means are well known in the art. The implanted oxygen or nitrogen apparently precipitates at the grain boundaries and does not migrate significantly with the temperatures and times used to activate the dopant.

FIGS. 4A-B illustrate the situation analogous to FIGS. 2A-B. In FIGS. 4A-B, device portion 49 which may be a MOSFET but need not be so, is composed of substrate 50 with superposed dielectric region 52 and poly region 53. Doped regions 51 may be provided at the same time as the doping of portion 53a of poly region 53 or formed otherwise. Poly region 53 contains portion 53b in which have been implanted oxygen or nitrogen ions 54 or mixtures thereof. Portion 53b is placed in region 53 before any high temperature processing has been performed in connection with the dopant ions 55 implanted in or otherwise introduce into portion 53a of region 53. Dopant ions 55 may be placed in poly region 53 either before or after oxygen or nitrogen ions 54, so long as the oxygen or nitrogen ions are present before dopant ions 55 are subjected to any high temperature annealing or activation steps. It is convenient to implant portion 53b before portion 53a.

To reduce or prevent the dopant migration and pile-up effects illustrated in FIGS. 2A-B, portion 53b must be between portion 53a and interface 52a at the boundary of poly region 53 and oxide region 52, i.e., in portion 53c of region 53. When high temperatures are applied, for example to activate dopant ions 55 in region 53, dopant ions 55 will rapidly migrate along the grain boundaries of layer 53 in the direction of arrows 56 until they encounter portion 53b. The oxygen or nitrogen in portion 53b plugs the grain boundaries of the poly grains in region 53b and substantially inhibits dopant migration therein. The result, as illustrated in FIG. 4B, is that portion 53f remains substantially free of dopant ions 55, or at least has a substantially lower level of dopant ions 55 than would otherwise be the case absent region 53b. The oxygen or nitrogen is believed to inhibit grain boundary migration by chemically binding to the surfaces of the grains, that is, occupying unsatisfied silicon bonds at the grain surfaces which would otherwise be available as transient, low activation energy sites for migrating dopant atoms.

EXPERIMENTAL RESULTS

Undoped polycrystalline silicon films about 0.6 microns thick were deposited on oxidized silicon wafers using LPCVD techniques well known in the art. Silicon oxide cap layers about 0.025 microns thick were grown or deposited on the poly layers. The oxide cap layers remained in place throughout all the implant and annealing steps, and were removed just prior to electrical tests, Auger analysis, and dopant profiling.

The as-deposited films or layers had grains typically about 0.02 microns across. Some of the layers were subjected to a high temperature pre-implant anneal in vacuum, typically at 1150-1250 degrees C. for 20-30 seconds using a type IA-200 Rapid Thermal Annealing (RTA) apparatus manufactured by Varian Associates, Inc., Gloucester, MA. This treatment increased the typical grain size to about 0.2 microns across. Other pre-anneal temperatures exceeding 1000 degrees C. and times in the range 1-90 seconds are useful with 1100-1300 degrees C. and 5-30 seconds being preferred. The higher the temperature the smaller the time required to achieve the same effect. Other inert ambients can also be used.

The polycrystalline layers were then oxygen implanted. Doses of $10^{14}$ to $10^{16}$/cm$^2$ of atomic oxygen (O+) at an energy of 200 keV were typically used. At this energy the peak of the implanted oxygen distribution is well within the bulk of the polycrystalline layer. Other energies can also be used, depending upon the thickness of the poly layer and the desired depth of the peak of the implant distribution. Those of skill in the art understand how to vary implant depth and dose, taking into account the differences in properties of the ions being implanted and the material into which implant occurs. Those of skill in the art will also understand that photoresist or other masking materials can be used to define particular areas to be implanted and areas not to be implanted. Such masking procedures are well known in the art.

The oxygen implanted layers were then heated typically to 650 degrees C. for 20 minutes to enhance the oxygen concentration at the grain boundaries. This step is desirable but not essential. Temperatures in the range 500-1000 degrees C. for times in the range 1-40 minutes are convenient. Higher temperatures and shorter times can also be used, for example, in the range 1000-1300 degrees C. for times of 1-60 seconds. A two step anneal is also desirable wherein the layer is first heated to temperatures in the range 500-1000 degrees C. for times of, for example 1-40 minutes, then followed by a higher temperature RTA anneal to temperatures in the range 1000-1300 for times of 1-60 seconds or less. Those of skill in the art will understand that with higher temperatures, less time may be required to obtain migration of the oxygen or nitrogen to the grain boundaries and precipitation thereon. Also, with smaller grain sizes, less time is required for oxygen or nitrogen to diffuse from within the grain to the grain boundary. Temperatures below about 500 degrees C. are not useful since the diffusion rate for oxygen in silicon within the grains is so low as preclude reasonable grain boundary oxygen or nitrogen concentration enhancement in a reasonable time. Those of skill in the art will understand that different times may be required when nitrogen, oxygen-nitrogen mixtures, or other materials are used.

The oxygen implanted polysilicon layers and control layers without oxygen were then implanted with a dopant known to substantially enhance the conductivity of the poly. As, B, P, Sb, Al, Ga, and In are well known examples of such dopants used in silicon. Other appropriate dopants are well known for other semiconductor materials.

Arsenic was implanted into the polycrystalline silicon layers typically to a dose of $5 \times 10^{15}$ ions/cm$^2$ of $^{75}$As+ at an energy of 150 keV. Under these conditions, the peak of the arsenic implant distribution is closer to the surface of the poly layer than is the peak of the implanted oxygen. Those of skill in the art understand that different doses and energies could be used depending upon the desired depth and location of the peak of the implanted distribution and the final desired resistance of the poly layer.

Where it is desired to use the implanted oxygen or nitrogen region to block rapid migration of the dopant toward a particular region or interface, then the region of enhanced oxygen or nitrogen concentration must be located vertically and/or horizontally between the dopant and the region or interface desired to be protected. Those of skill in the art will understand that masking layers of photoresist or other materials may be used to laterally delineate particular dopant or oxygen implant areas and the implant energy may be varied to adjust the implant depth.

Following implantation of the dopant, the poly layer is heated to activate the dopant, i.e., render it electically active, and anneal any residual implant damage. Temperatures in the range of about 1000 to 1300 degrees C. and times in the range 1 to 20 seconds are useful. Those of skill in the art understand that the higher the temperature, the smaller the time required to activate the dopant. If too high a temperature or too long a time is used, diffusion through the bulk of the grains will distribute the dopant substantially uniformly through the poly layer despite the presence of the oxygen or nitrogen implanted region. This is because the oxygen or nitrogen implant apparently has its most important effect in retarding grain boundary migration of the dopant.

The same RTA apparatus was used for activation as used for the pre-implant anneal step. Typically, the RTA apparatus was set to a particular peak temperature, e.g. 1100 degrees C., and energized. The temperature of the supporting wafer and poly layer increased in less than about five seconds to the pre-set peak temperature, whereupon the shutter in the RTA dropped between the heater and the wafer. The supporting wafer and poly layer then dropped back to about room temperature within about an additional ten to fifteen seconds. Thus, total RTA time was about twenty seconds or less. It is estimated that the effective activation/annealing time, i.e., the equivalent time at peak temperature, is about one second. Control samples were processed in substantially the same manner as described above but without the oxygen implant.

FIG. 5 shows the results of an Auger analysis of the oxygen concentration as a function of depth in the polycrystalline silicon layers both before and after an RTA step identical to that used for activation of the arsenic dopant. The oxygen implant dose was $10^{16}/cm^2$ at 200 keV. The sputtering rate of the layer was about 0.01 microns per minute, i.e., about 60 minutes to sputter through the 0.6 micron poly layer. From the data of FIG. 5 it is apparent that, within the accuracy of the measurement, there is no substantial migration of the implanted oxygen as a result of the 1100–1200 degree C. RTA treatment.

Assuming that the Auger peak height is linearly proportional to the concentration of silicon or oxygen, the peak implanted oxygen concentration in the polysilicon layer is about 0.6%, that is about $3 \times 10^{20}$ oxygen atoms/$cm^3$. The peak of the implanted oxygen distribution appears to be about 0.2–0.25 microns below the surface of the poly layer. Since the Auger analysis sputtering was carried on completely through the poly layer, through the underlying silicon oxide layer and into the substrate, the oxygen concentration near the oxide interface and in the oxide layer can also be determined. It is apparent that, within the depth discrimination of the method, there is substantially no oxygen migration from the oxide layer into the poly silicon layer. The oxygen to silicon ratio in the oxide layer is substantially 2:1 as is expected.

FIG. 6 shows the arsenic concentration as a function of depth for fine grain poly layers (no pre-implant anneal) which were arsenic implanted to $5 \times 10^{15}$ ions/$cm^2$ at 150 keV and RTA activated at various temperatures, without oxygen implantation (solid lines) and with oxygen implantation of $10^{16}$ ions/$cm^2$ at 200 keV (dashed lines), according to the methods previously described. The arsenic concentrations were measured by Rutherford backscattering analysis techniques well known in the art. The peak of the as-implanted arsenic distribution is about 0.05 microns below the surface of the poly layer. This is about 0.15–0.2 microns shallower than the oxygen implant. The temperatures noted on the curves of FIG. 6 are the pre-set peak RTA activation temperatures and the effective time at peak temperature is estimated to be about one second. It is apparent from FIG. 6 that the arsenic migrates extremely rapidly through the untreated poly layer. The presence of the implanted oxygen significantly retards the migration of the implanted arsenic. The effect is greatest for lower activation temperatures.

FIG. 7 shows similar data for otherwise identical conditions except that the poly layers had received a pre-implant anneal to increase the grain size, as described above. It is apparent that the increased grain size also retards grain boundary migration of the dopant. When the oxygen implant is provided, the effects are cumulative, i.e., migration of the dopant is further inhibited.

Other tests showed that oxygen implant doses of $10^{14}$ ions/$cm^2$ produced little dopant migration blocking effect for the arsenic concentrations used. Significant effects were observed at $10^{15}$ ions/$cm^2$ and larger effects at $10^{16}$ ions/$cm^2$. It is expected that the magnitude of the blocking effect will increase with even larger oxygen doses and smaller dopant doses. However, oxygen or nitrogen doses larger than about $10^{17}$ ions/$cm^2$ are not desirable in many cases because of the adverse affect of such high oxygen concentrations on the sheet resistance of the poly layers. Where sheet resistance is not a consideration, larger doses could be used. However, at sufficiently large doses, i.e., about $10^{18}$ ions/$cm^2$ or above, a thin, distinct insulating silicon oxide or nitride layer may form within the semiconductor material.

The effect of oxygen implantation on sheet resistance of the poly layers was measured using oxygen implants at doses of $10^{14}$ to $10^{16}$ ions/$cm^2$ at 200 keV in polycrystalline silicon. The sheet resistance of polycrystalline silicon layers constructed as described above was measured using standard four point probe techniques. Such techniques are well known in the art. Some of the layers were annealed prior to oxygen implantation to increase the grain size from about 0.02 to 0.2 microns. These samples are identified as "fine" and "large" grained poly respectively in Table I below. The layers were arsenic doped to a dose of $5 \times 10^{15}$ ions/$cm^2$ at an energy of 150 keV. Control samples without oxygen implantation were similarly doped. The sheet resistance of the various samples is presented in Table I below. The Rapid Thermal Annealing (RTA) was carried out as previously described. The RTA temperatures shown are the pre-set peak temperatures that the wafer containing the polycrystalline layer reached. The effective activation time at peak temperature is estimated to be about one second.

TABLE I

| | | SHEET RESISTANCE OF As DOPED POLYSILICON LAYERS (Ohms/Sq.) | | | |
|---|---|---|---|---|---|
| RTA TEMP. DEGREES C. | GRAIN SIZE | CONTROL NO OXY. | OXYGEN $10^{14}$ | DOSE $10^{15}$ | (ions/$cm^2$) $10^{16}$ |
| 1100 | FINE | 125 | 130 | 160 | 240 |
| 1100 | LARGE | 67 | 67 | 74 | 145 |
| 1150 | FINE | 90 | 90 | 102 | 155 |
| 1150 | LARGE | 62 | 62 | 65 | 90 |

The results presented in Table I show that while some increase in sheet resistance does occur as a result of oxygen implantation, the changes for oxygen doses (e.g. $10^{16}$ ions/$cm^2$) sufficient to provide a large dopant migration blocking effect are not so large as to render the polysilicon layer not useful for device purposes.

While the invented means and method has been illustrated in terms of polycrystalline silicon wafers and oxygen, those of skill in the art will understand that other elements such as nitrogen or nitrogen oxygen mixtures could also be used. Further, those of skill in the art will understand that other dopants besides arsenic can be employed as the conductivity altering dopant.

Further, those of skill in the art will understand that the principles taught herein apply to other semiconductor materials, such as for example, but not limited to, germanium and III-V materials. Accordingly, it is intended to include all such variations in the claims which follow.

We claim:

1. A semiconductor device comprising:
   a substrate;
   a polycrystalline semiconductor layer having a first surface in contact with said substrate and a second surface opposite said first surface;
   a first region within said polycrystalline semiconductor layer containing oxygen at a concentration in the range $10^{19}$ to $10^{21}$ atoms/cm$^3$;
   a second region in said polycrystalline semiconductor layer containing a peak concentration of a conductivity altering dopant; and
   wherein a portion of said first region lies between said second region and said first surface.

2. The device of claim 1 wherein said first region has a thickness of at least one-fourth the thickness of said polycrystalline semiconductor layer.

3. A semiconductor device comprising:
   a substrate;
   a polycrystalline semiconductor layer having a first surface in contact with said substrate and a second surface opposite said first surface;
   a first region within said polycrystalline semiconductor layer containing oxygen at a concentration in the range $10^{19}$ to $10^{21}$ atoms/cm$^3$;
   a second region in said polycrystalline semiconductor layer containing a peak concentration of a conductivity altering dopant; and
   wherein a portion of said first region lies between said second region and said second surface.

4. The device of claim 3 wherein said first region has a thickness of at least one-fourth the thickness of said polycrystalline semiconductor layer.

5. A semiconductor device comprising:
   a substrate having an insulating surface;
   a polycrystalline semiconductor layer on said insulating surface, wherein said polycrystalline layer has a first region doped with a first dopant a second region substantially free of said first dopant, and a third region containing oxygen or nitrogen at a concentration in the range $10^{19}$ to $10^{21}$ atoms/cm$^3$ located laterally between said first and second regions.

6. A semiconductor device comprising:
   a substrate having an insulating surface;
   a polycrystalline semiconductor layer on said insulating surface, wherein said polycrystalline layer has a first region doped with a first dopant, a second region substantially free of said first dopant, and a third region implanted with oxygen or nitrogen to a dose in the range from more than $10^{14}$ to less than $10^{17}$ ions/cm$^2$ located laterally between said first and second regions.

7. The semiconductor device of claim 6 wherein said dose is in the range from $10^{15}$ to about $10^{16}$ ions/cm$^2$.

* * * * *